US006624674B1

(12) United States Patent
Zhao

(10) Patent No.: US 6,624,674 B1
(45) Date of Patent: Sep. 23, 2003

(54) METHOD AND APPARATUS FOR REDUCING VARIATIONS ON DAMPING FACTOR AND NATURAL FREQUENCY IN PHASE LOCKED LOOPS

(75) Inventor: Cangsang Zhao, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/127,574

(22) Filed: Apr. 23, 2002

(51) Int. Cl.[7] ................................ H03L 7/06
(52) U.S. Cl. ...................... 327/156; 327/147
(58) Field of Search ................... 327/141, 144, 327/146, 147, 148, 155, 156, 157, 536, 530, 534, 535; 331/17, 25; 375/371, 373, 374, 375, 376

(56) References Cited

U.S. PATENT DOCUMENTS

| 5,408,202 | A | * | 4/1995 | Shirazi et al. ............... 331/8 |
| 5,727,037 | A | * | 3/1998 | Maneatis .................. 375/376 |
| 5,854,575 | A | * | 12/1998 | Fiedler et al. ............. 331/10 |
| 6,320,458 | B1 | * | 11/2001 | Cusinato et al. ........... 327/543 |
| 6,441,660 | B1 | * | 8/2002 | Ingino, Jr. ................ 327/156 |
| 6,462,596 | B1 | * | 10/2002 | Varma ..................... 327/218 |
| 6,466,069 | B1 | * | 10/2002 | Rozenblit et al. .......... 327/157 |
| 2002/0149087 | A1 | * | 10/2002 | Okada ..................... 257/533 |

\* cited by examiner

Primary Examiner—Timothy P. Callahan
Assistant Examiner—Linh Nguyen
(74) Attorney, Agent, or Firm—Antonelli, Terry, Stout & Kraus, LLP

(57) ABSTRACT

The present invention is related to method and apparatus for reducing variations on damping factor and natural frequency in phase locked loops where a desired frequency range from a PLL is determined. A loop filter resistance of the PLL is adjustable to minimize variations on the damping factor of the PLL as the frequency of the PLL changes. Further, the frequency of an input clock to the PLL may be determined along with a value of a PLL frequency multiplier. A first ratio of the current in a first charge pump to a VCO tail current and a second ratio of the current in a second charge pump to the VCO tail current may be adjusted, where the first ratio and the second ratio are adjustable to minimize variations on the natural frequency of the PLL as the input clock frequency and/or the PLL multiplier value of the PLL changes.

28 Claims, 10 Drawing Sheets

METHOD AND APPARATUS FOR REDUCING VARIATIONS ON DAMPING FACTOR AND NATURAL FREQUENCY IN PHASE LOCKED LOOPS

BACKGROUND

1. Field

This invention relates to phase locked loops (PLLs), and more specifically to improving PLL jitter performance and stability.

2. Background

Phase locked loops (PLLs) are commonly used for microprocessor clock generation. As the frequency of the PLL is increased to allow the microprocessor to run faster, the loop dynamics of the PLL varies and PLL stability becomes an issue. These PLL loop dynamics relate to the PLL damping factor and natural frequency. As the output frequency of the PLL increases and the loop dynamics of the PLL vary, this results in increased jitter at the output clock of the PLL.

Equation 1 shows a relationship of damping factor to loop filter resistance, where y is the ratio of loop filter resistance to the VCO (voltage controlled oscillator) VCR (voltage controlled resistance) and N is the core PLL frequency multiplier value. These are not all of the parameters that factor into the damping factor.

$$\text{Damping factor } \zeta \propto \frac{y}{\sqrt{N}} \quad (1)$$

A damping factor represents how stable a system is. As shown in Eq. 1, the damping factor is proportional to the ratio loop filter resistance of the PLL over the square root of a multiplier value of the PLL. Therefore, as the range of frequencies from the PLL varies, the multiplier value varies, therefore, affecting the damping factor.

For example, if the PLL supplies a core clock of 1 GHz and 6 GHz, from an input frequency of 100 MHz, a multiplier value of 10 and a multiplier value of 60 may be used, respectively. Plugging these into Eq. 1 shows that the damping factor will experience a large variation causing jitter that may be hard to tolerate in the system.

Equation 2 shows a relationship of the natural frequency to input clock frequency and charge pump current. The natural frequency is shown as $\omega_N$ and $\omega_{input}$ is the PLL input frequency. Another relationship regarding the damping factor is shown in equation 3.

$$\text{Natural frequency } \omega_N \propto \omega_{input}\sqrt{x_1 N} \quad (2)$$

$$\text{Damping factor } \zeta \propto \frac{x_2}{\sqrt{x_1 N}} \quad (3)$$

As the frequency of the PLL increases, generally the input frequency to the PLL increases. As shown in Eq. 2, the natural frequency of the PLL is proportional to the input frequency multiplied by the square root of a ratio $x_1$ multiplied by the PLL frequency multiplier value N. The ratio, $x_1$, is a ratio of the charge pump current in a first charge pump to the VCO tail current. The parameter $x_2$ is a ratio of the charge pump current in a second charge pump to the VCO tail current. As shown in Eq. 3, both the ratio $x_1$ and the ratio $x_2$ affect the damping factor since the damping factor is proportional to $x_2$ divided by the square root of $x_1$ multiplied by N. Therefore, as can be seen from Eq. 2, as the input frequency increases, the natural frequency increases. As the natural frequency increases, the amount of jitter at the input to the PLL increases. This jitter at the input of the PLL may be magnified through the PLL where it then shows up on the output core clock of the PLL.

Currently, a cascaded PLL approach is used to reduce damping factor variation. The input clock for the core PLL is the output clock of a previous PLL. Frequency multipliers that receive the first PLL output clock reside between the first PLL and the core PLL. Any one of the outputs of the multipliers may be selected to be the input clock to the core PLL. This makes it possible to change core PLL input clock frequency according to the multiplier value needed for the core PLL output clock frequencies. Therefore, the frequency multiplier value N for the core PLL can be set to vary less (for a given range of frequencies), meaning its damping factor will vary less.

However, cascaded PLLs are problematic in that the bandwidths for the two PLLs have to be separated big enough so that jitters are not amplified twice. This limits PLL design flexibility and optimization. Moreover, a cascaded PLL approach does not address the issue of large natural frequency variation. Further, a cascaded PLL approach requires two PLLs, therefore, requiring more space and other resource requirements.

BRIEF DESCRIPTION OF THE DRAWINGS

The present invention is further described in the detailed description which follows in reference to the noted plurality of drawings by way of non-limiting examples of embodiments of the present invention in which like reference numerals represent similar parts throughout the several views of the drawings and wherein.

DETAILED DESCRIPTION

The particulars shown herein are by way of example and for purposes of illustrative discussion of the embodiments of the present invention. The description taken with the drawings make it apparent to those skilled in the art how the present invention may be embodied in practice.

Further, arrangements may be shown in block diagram form in order to avoid obscuring the invention, and also in view of the fact that specifics with respect to implementation of such block diagram arrangements is highly dependent upon the platform within which the present invention is to be implemented, i.e., specifics should be well within purview of one skilled in the art. Where specific details (e.g., circuits, flowcharts) are set forth in order to describe example embodiments of the invention, it should be apparent to one skilled in the art that the invention can be practiced without these specific details. Finally, it should be apparent that any combination of hard-wired circuitry and software instructions can be used to implement embodiments of the present invention, i.e., the present invention is not limited to any specific combination of hardware circuitry and software instructions.

Although example embodiments of the present invention may be described using an example system block diagram in an example host unit environment, practice of the invention is not limited thereto, i.e., the invention may be able to be practiced with other types of systems, and in other types of environments.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

The present invention is related to method and apparatus for reducing variations in damping factor and natural frequency in phase lock loops where the loop filter resistance of the phase lock loop is digitally adjustable to minimize variations on the damping factor. Moreover, a charge pump strength is digitally adjustable according to input clock frequency and PLL multipliers to minimize variation on the damping factor and natural frequency.

Figure 1:
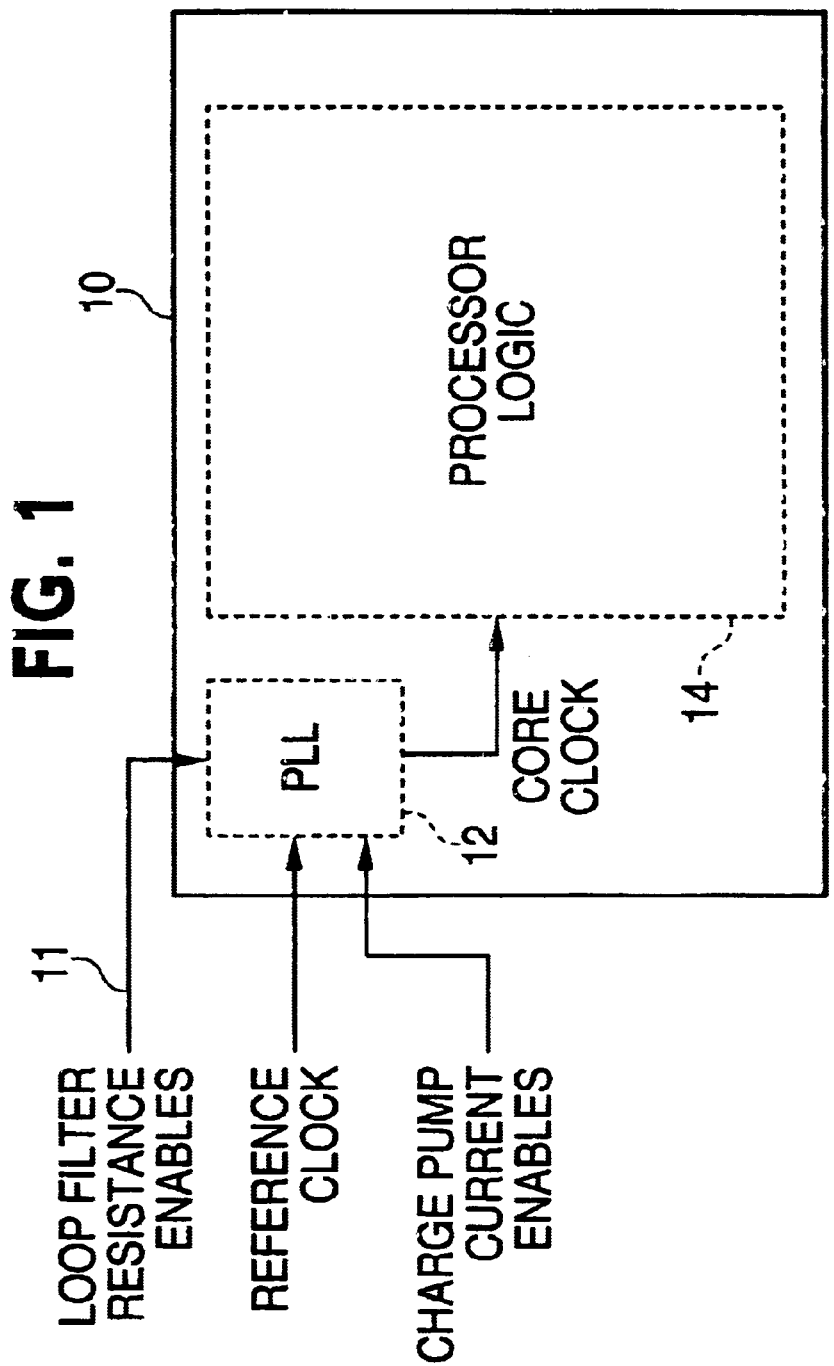
FIG. 1 is a block diagram of an integrated circuit including a PLL according to an example embodiment of the present invention.

FIG. 1 shows a block diagram of an integrated circuit including a PLL according to an example embodiment of the present invention. Integrated circuit 10 contains a phase lock loop (PLL) 12 that supplies a core clock to processor logic 14. Processor logic 14 may be a microprocessor, I/O processor or other type of processor that runs at various high speeds. The PLL 12 receives a reference clock that it may use to generate the core clock supplied to processor logic 14. Either the loop filter resistance and/or the charge pump current may be adjusted via control signals/enables 11 and 13, respectively. The loop filter resistor enable signals 11 and the charge pump current enable signals 13 may be sourced external to the integrated circuit 10 and connected to the PLL 12 on the integrated circuit 10. The loop filter resistor enable signals 11 and the charge pump current enable signals 13 may also be sourced internal to the integrated circuit 10.

Therefore, according to the present invention, as the speed of the processor 14 changes, the loop filter resistance and/or charge pump current may be varied to reduce variations on the damping factor and natural frequency of the PLL, therefore, allowing better PLL jitter performance. A PLL used with a processor on an integrated circuit or microcircuit is a common architecture. However, a PLL implementing the present invention is not limited to being part of an integrated circuit. The present invention may be implemented in a PLL that is a stand alone PLL device, discrete circuitry as a part of a motherboard, or any other use or implementation and still be within the spirit and scope of the present invention.

Figure 2:
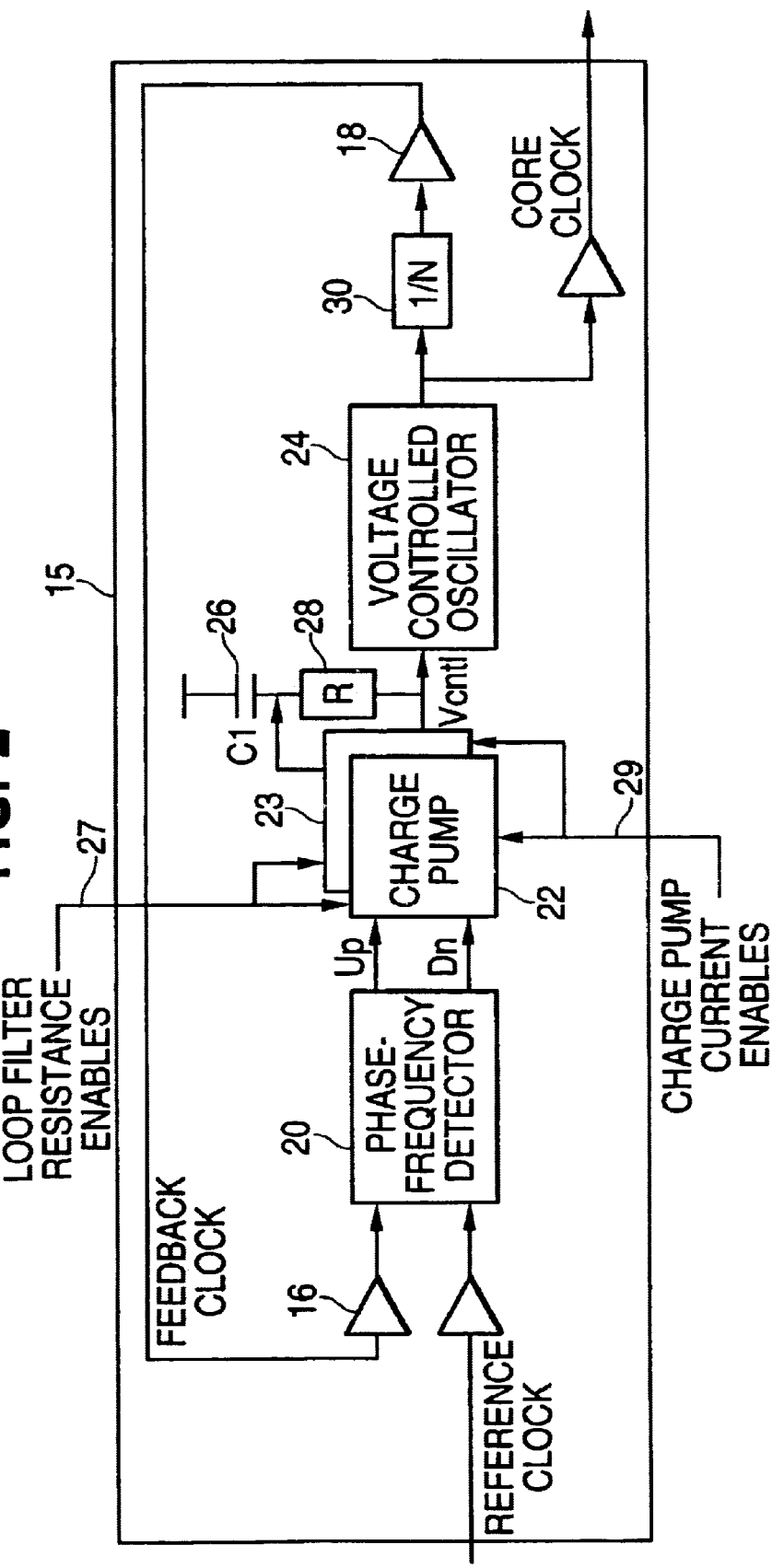
FIG. 2 is a diagram of a PLL according to an example embodiment of the present invention.

FIG. 2 shows a diagram of a PLL according to an example embodiment of the present invention. The PLL 15 may include a phase-frequency detector 20, one or more charge pumps 22, 23, a voltage controlled oscillator 24, loop filter resistance section 28, loop filter capacitance 26, a frequency multiplier 30, and drivers 18 and receivers 16. Frequency multiplier 30 takes the VCO 24 output clock and divides it down to a smaller frequency clock that is fed back to phase frequency detector 20. Phase frequency detector 20 receives this feedback clock along with an input reference clock and determines a phase difference between the two clocks. Depending on the phase difference detected, the phase frequency detector 20 asserts either an up signal or a down signal to the one or more charge pumps 22, 23, therefore, causing the charge pump to increase the current or decrease the current outputted. The increase or decrease in current from the charge pumps causes a control voltage (Vcntl) at a voltage control node input to voltage controlled oscillator 24 to go up or down respectively. The control voltage into VCO 24 causes the VCO to adjust the VCO output frequency so that it is the desired frequency. The output of the voltage controlled oscillator 24 is the core clock sent external to the PLL 15.

Loop filter resistance enables 27 connect to loop filter resistance section 28 (e.g., via the charge pumps 22, 23) to allow adjusting of the loop filter resistance. Further, charge pump current enables 29 connect to charge pumps 22 and 23 allowing control of the current in the charge pumps. The loop filter resistance enables 27 and the charge pump current enables 29 may be controlled based on the desired frequency of the core clock. Once the core clock frequency is known, the multiplier value 30 may be determined. The loop filter resistance 28 may then be adjusted accordingly using loop resistance enables 27 to minimize the variations on the damping factor of the PLL. Similarly, if the core clock frequency is increased by increasing the input reference clock, the PLL may have a higher natural frequency and, therefore, be more sensitive to input jitter. The charge pumps current may then be adjusted accordingly using charge pump enables 29 to minimize the variations on the natural frequency of the PLL. Adjusting the charge pump currents, as can be seen from Eq. 3, helps to reduce the effects of this input jitter on the core clock. Therefore, the range of variation in the natural frequency of the PLL will be smaller at a higher core clock frequency.

Figure 3:
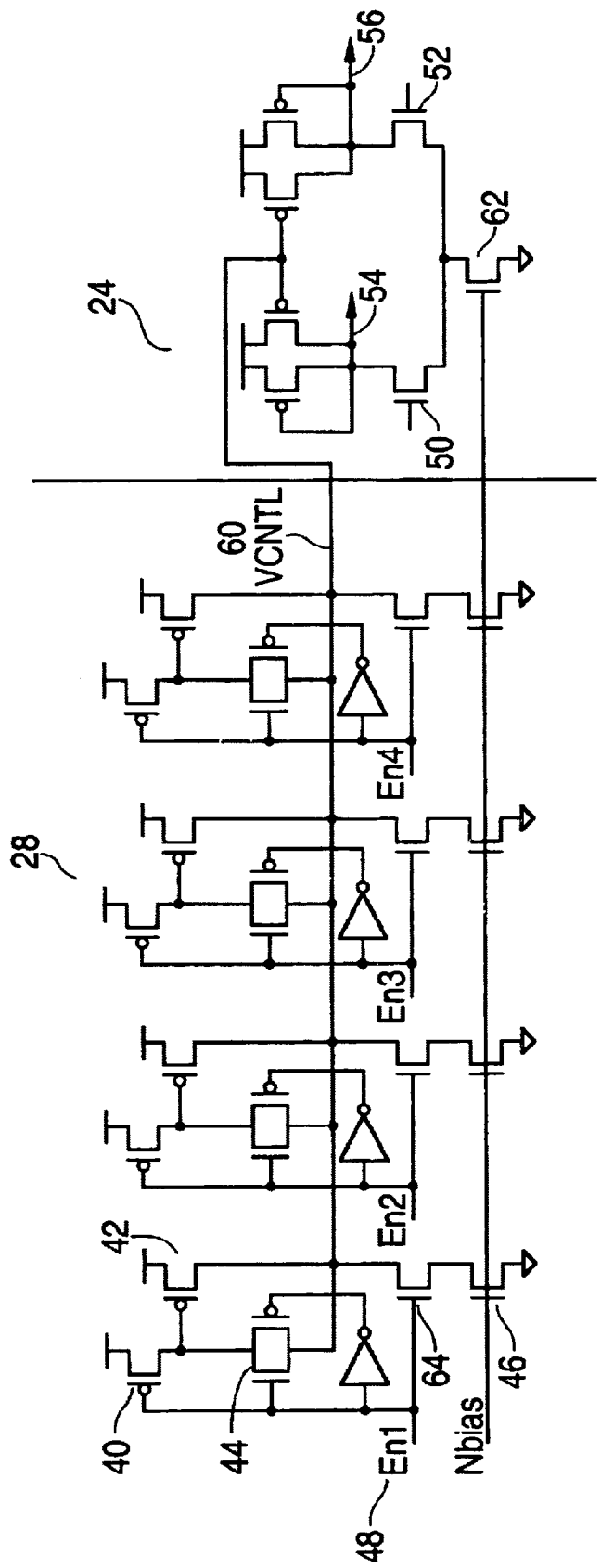
FIG. 3 is a schematic diagram of a loop filter resistor section and VCO section of a PLL according to an example embodiment of the present invention.

FIG. 3 shows a schematic diagram of a loop filter resistor section and VCO section of a PLL according to an example embodiment of the present invention. FIG. 3 includes a VCO section 24 and loop filter resistance section 28. The VCO section 24 shows one stage of possibly several stages that may be interconnected to form the VCO. These other stages may be interconnected via the base of device 50 and the base of device 52 in a circular ring configuration. The VCO 24 may have differential outputs 54 and 56 that supply the output VCO clock. The Vcntl voltage 60 controls the frequency of the VCO 24. The VCO tail current is the current passing through device 62 in VCO 24. As noted previously, there may be multiple stages connected in parallel and included in VCO 24, in which case, there will be a VCO tail current for each section.

Loop filter resistor section 28 shows an example embodiment that includes, for example, four identical resistive sections. Each resistive section includes its own unique enable signal 48. In this example embodiment, each resistive section is composed of PMOS transistors 40 and 42 and pass gate 44. NMOS devices 64 and 46 (which receives the Nbias current) complete the devices in the resistive element. When an enable 48 to a resistive section is set equal to 0, the pass gate 44 is turned off, MOS device 40 is turned on and thus drawing current, therefore, pulling up the voltage level on the gate of MOS device 42. This turns device 42 off. In contrast, when the enable 48 is at a logic 1 level, this turns on pass gate 44 and also turns off device 40. MOS device 42 then turns on and becomes a diode-connected structure giving resistance. Thus, enable 48 uses pass gate 44 as a switch to enable/disable MOS device 42 as a resistive element in the loop filter resistance section.

Each of the enables may be set to enable or disable its respective resistive section, therefore, either increasing or decreasing the overall loop filter resistance of the loop filter resistance section 28. As noted in equation 1 previously, the damping factor is proportional to the ratio of loop filter resistance to the VCO voltage controlled resistance (VCR). Therefore, by varying the loop filter resistance, the damping factor may be reduced. Although a loop filter resistance section 28 and voltage controlled oscillator section 24 are shown in FIG. 3 using MOS technology devices, the present invention is not limited to this implementation of a loop filter resistance section or voltage controlled oscillator section. These sections may be implemented in many different ways to perform the same functions and still be within the spirit and scope of the present invention.

Figure 4:
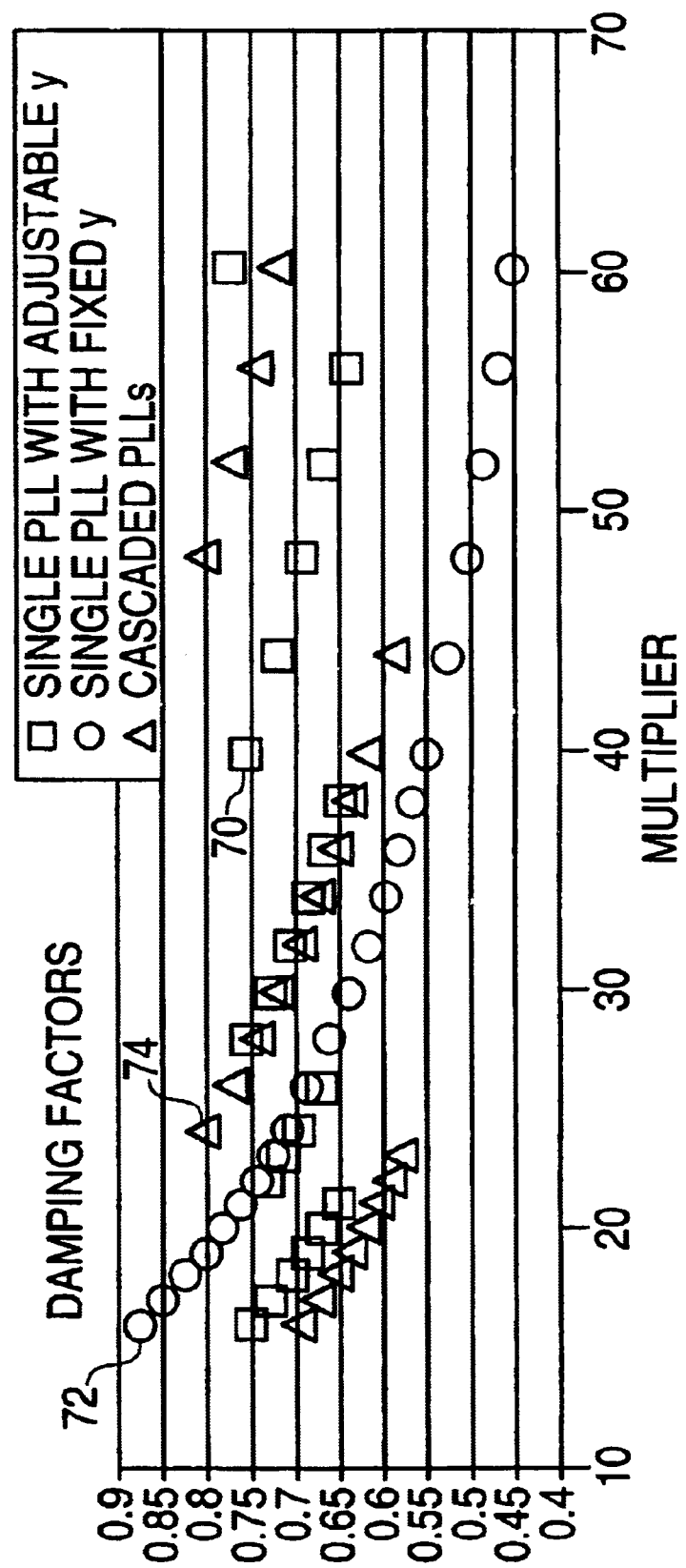
FIG. 4 is a graph of damping factors comparing current PLLs with PLLs according to example embodiments of the present invention.

FIG. 4 shows a graph of damping factors comparing other PLLs with PLLs according to example embodiments of the present invention. The Y-axis of the graph represents damping factors and the X-axis represents frequency multiplier values. The graph depicts comparisons between three different PLL configurations, current single PLL configurations with the ratio (y) of loop filter resistance to VCO VCR resistance being fixed, single PLL with an adjustable y, and cascaded PLLs. The circles 72 represent the single PLL with a fixed y configuration, the triangles 74 represent a cascaded PLL configuration, and the squares 70 represent a single PLL with adjustable y configuration according to the present invention. As can be seen in FIG. 4, implementations and embodiments incorporating the present invention show that for a given multiplier value, the damping factor range or variation is much smaller than the other implementations, i.e., single PLL with fixed y and cascaded PLLs. With a smaller variation and damping factor, jitter is also substantially reduced.

Figure 5:
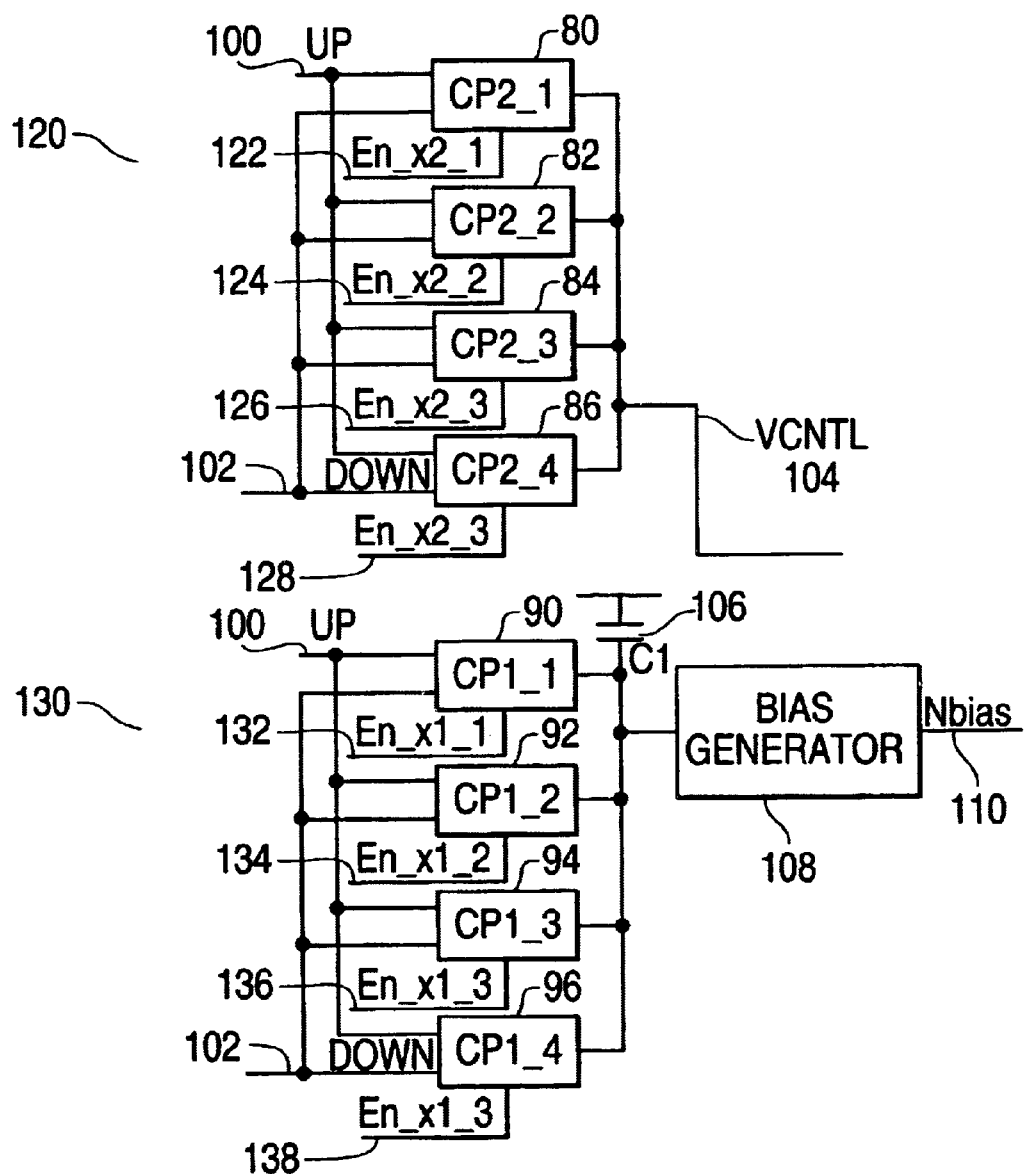
FIG. 5 is a diagram of charge pump configurations according to an example embodiment of the present invention.

FIG. 5 shows a diagram of charge pump configurations according to an example embodiment of the present invention. This figure includes two charge pumps, i.e., a charge pump2, 120, and a charge pump1, 130, both of which are comprised of multiple sub-charge pumps or sections. Charge pump 120 may be made up of several charge pumps 80, 82, 84 and 86, each with its own unique enable signal, 122–128, respectively. All charge pump portions 80–86 receive a common up signal 100 and down signal 102 that may be supplied from a phase frequency detector as noted previously. Each enable signal 122–128 turns on or enables its respective charge pump portion 80–86. The total current coming out of charge pump 120, therefore, is the sum of the currents coming from each individual charge pump portion 80–86. Therefore, according to the present invention, enables 122–128 may be used to adjust and vary the amount of current from the charge pump 120. The charge pump 120 output current directly effects the Vcntl voltage 104 going into a voltage control oscillator.

Similarly, the charge pump1 130 may include charge pump portions 90–96. Each charge pump portion 90–96 has its own unique enable signal 132–138, respectively, that enables or disables that particular charge pump portion. Charge pump portions 90–96 also may be connected to the up signal 100 and down signal 102. The total current out of charge pump 130 is, therefore, the sum of the currents emitted from each of charge pump portions 90–96. This total current from charge pump1, 130, may be used to supply current to a bias generator 108 which may in turn supply the Nbias current 110 to the voltage control oscillator. The capacitor 106 may represent the loop filter capacitance of the PLL.

Figure 6:
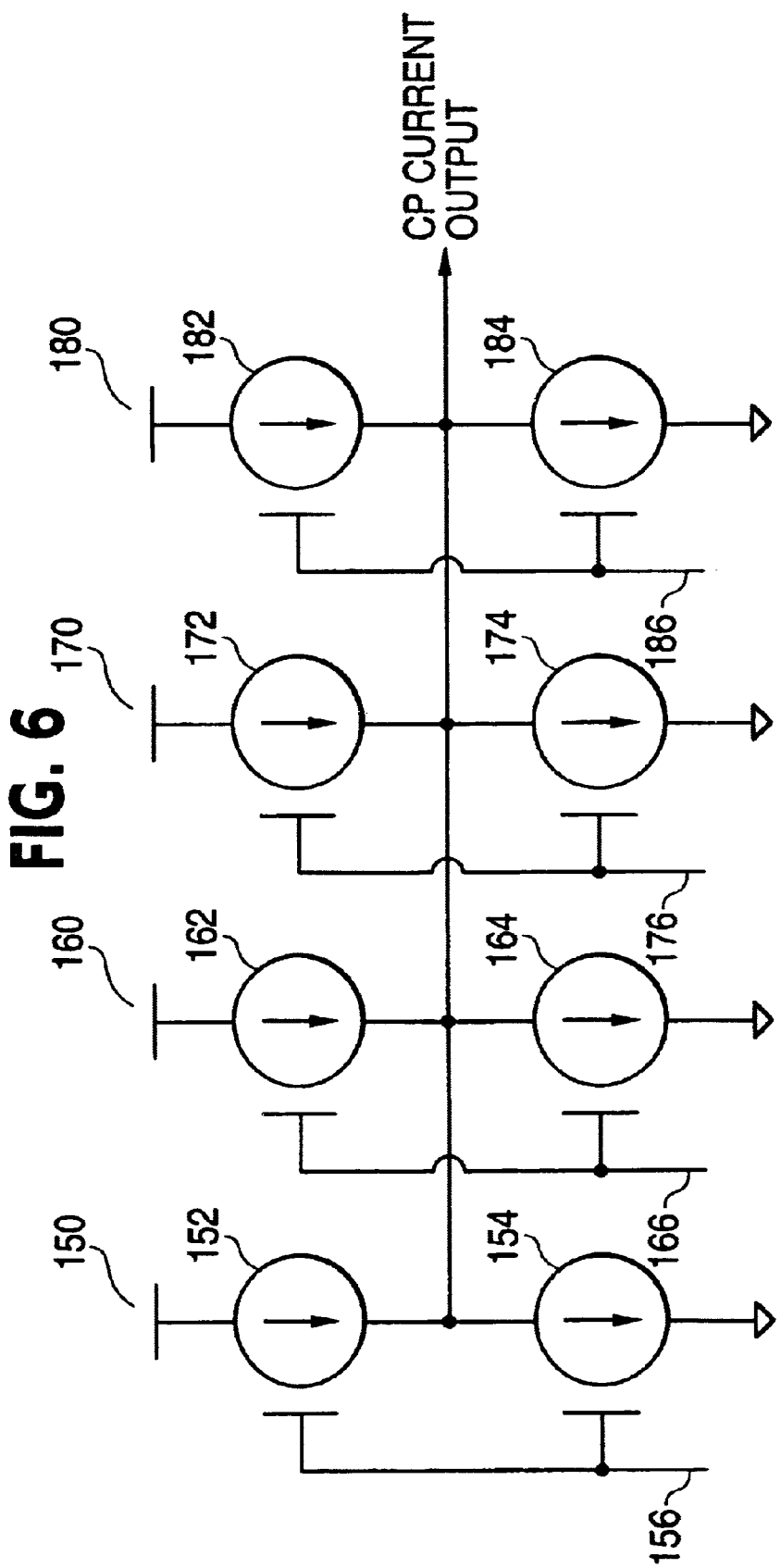
FIG. 6 is a diagram of a charge pump according to an example embodiment of the present invention.

FIG. 6 shows a diagram of a charge pump according to an example embodiment of the present invention. The charge pump may include multiple sections. The example embodiment shown in FIG. 6 includes four charge pump sections, 150, 160, 170, and 180. Each charge pump section may be composed of two current sources enabled by a common enable. The charge pump section 150, includes two current sources 152 and 154 enabled by enable signal 156. The charge pump section 160 includes two current sources 162 and 164 enabled by enable signal 166. The charge pump section 170 includes two current sources 172 and 174 enabled by enable signal 176. Charge pump section 180 includes two current sources 182 and 184 enabled by enable signal 186. Although this example embodiment of the present invention shows four individual sections of the charge pump, the present invention is not limited by this embodiment. A charge pump may include one or more charge pump sections and still be within the spirit and scope of the present invention.

The total current generated by the charge pump is the sum of the currents generated by each section 150, 160, 170 and 180 of the charge pump. Therefore, the charge pump current in the ratios $x_1$ and $x_2$ in Eq. 2 and Eq. 3 refer to the total charge pump current, i.e., the sum of the currents in each charge pump section 150, 160, 170, 180, divided by the VCO stage tail current. According to the present invention, by enabling or disabling the charge pump sections of each charge pump, the current ratios $x_1$ and $x_2$ in Eq. 2 and Eq. 3 may be controlled. For example, if the enable signal 156 is set such that current sources 152 and 154 are disabled, the current coming from charge pump section 150 would be zero, thus decreasing the total current from the charge pump if the other three charge pump sections 160, 170 and 180 had been enabled.

Figure 7:
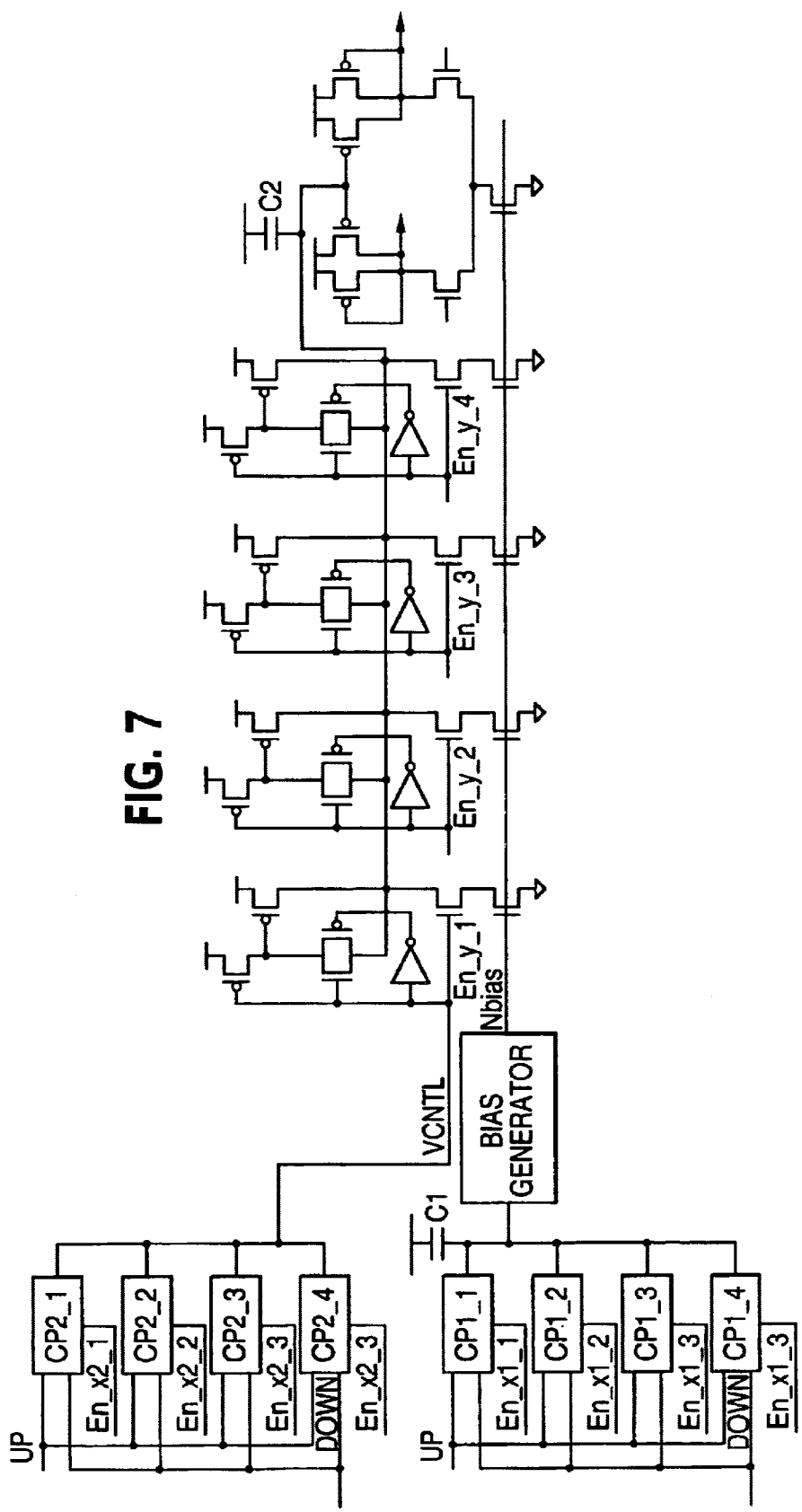
FIG. 7 is a diagram of a system for minimizing variations on damping factor and natural frequency according to an example embodiment of the present invention.

FIG. 7 shows a diagram of a system for minimizing variations on damping factor and natural frequency according to an example embodiment of the present invention. FIG. 7 shows a system that includes the elements of FIGS. 3 and 5 and that obtains the benefits of the damping factor variation reduction of FIG. 3 as well as the natural frequency variation reduction of the circuit in FIG. 5. Therefore, the system shown in FIG. 7 is highly advantageous in that the enables to each of the charge pump sections, and to each of the loop filter resistance sections may be controlled to minimize variations on both damping factor and natural frequency of the PLL, thus minimizing jitter on the core clock emitted from the PLL via the VCO.

Figure 8:
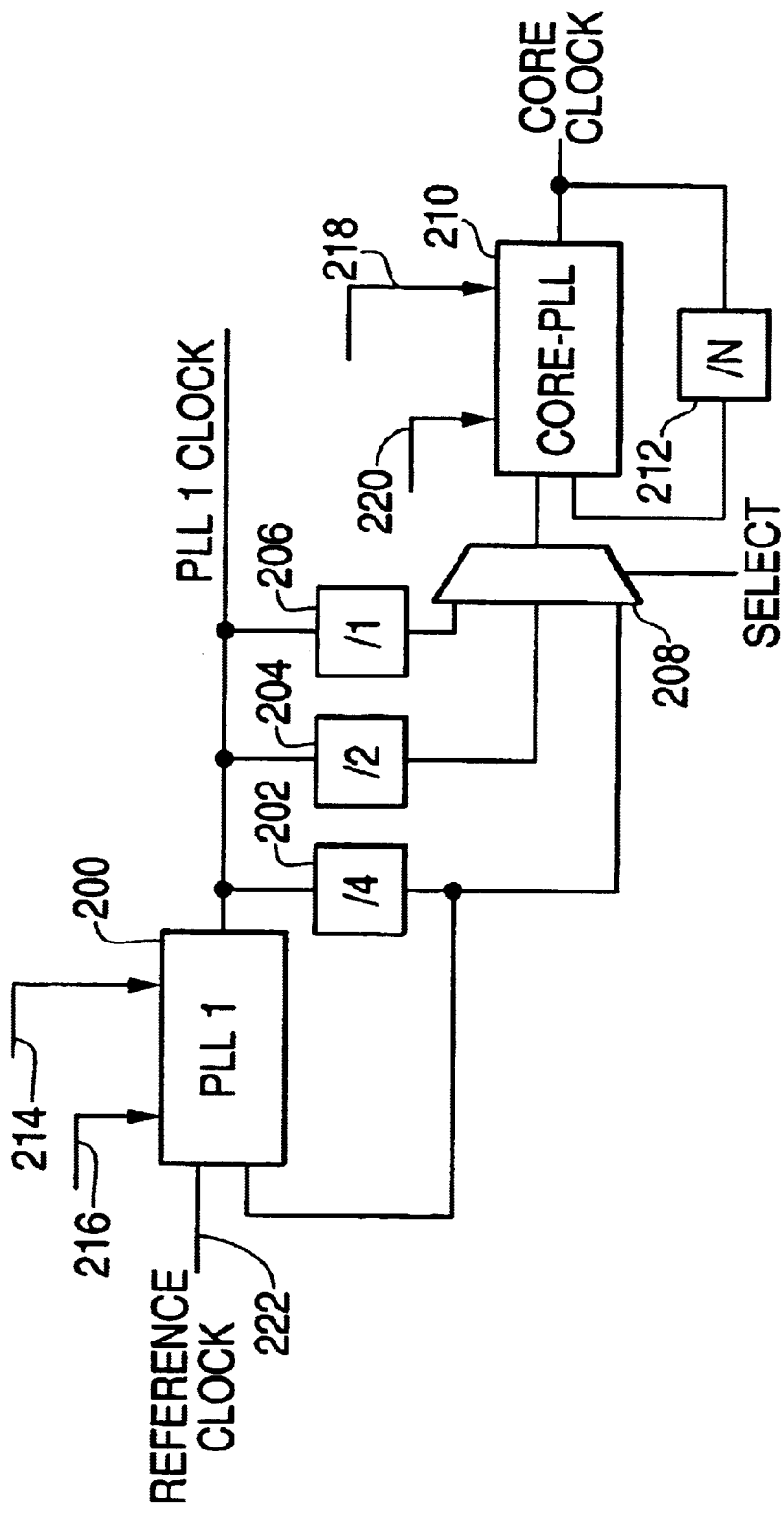
FIG. 8 is a diagram of a cascaded PLL according to an example embodiment of the present invention.

FIG. 8 shows a diagram of a cascaded PLL according to an example embodiment of the present invention. In this embodiment, further improvements in jitter may be achieved by using a cascaded configuration of PLLs in combination with adjustable loop filter resistances and charge pump currents as mentioned previously. In this embodiment of the present invention, two PLLs, 200, 210 are configured in a cascaded configuration. The first PLL 200 receives a reference clock 222 as well as enable signals 214 for the sections of each charge pump and enable signals 216 for each loop filter resistance section. Multipliers 202, 204 and 206 receive the output of the first PLL 200, divide the frequency, and may connect to a switching device 208 such as a multiplexer. The switching device 208 selects one of the outputs from the multipliers 202, 204, 206, and passes this to the input of the second PLL 210.

A feedback path may also be provided from one of the multipliers, in this case multiplier 202, back to an input of the first PLL 200. The frequency multipliers 202, 204 and 206 serve to divide the output frequency of the first PLL 200 such that one of the frequencies from the frequency multipliers may be selected by switching device 208 and passed to the input of the second core PLL 210. The core PLL 210 may also receive charge pump current enable signals 218 for controlling the various charge pump sections in the charge pump, as well as loop filter resistance enable signals 220 for controlling the loop filter resistive sections of core PLL 210.

The core PLL 210 also may include a frequency multiplier 212 that takes the output clock of core PLL 210 and feeds it back into the core PLL 210. Core PLL 210 generates the core clock. As noted previously, cascaded PLL configurations may be used to reduce damping factor variation. Since the input clock to the core PLL 210 is a version of the output clock of the first PLL 200, it is possible to change the core PLL 210 input clock frequency according to the frequency multipliers needed for the desired core clock out of core PLL 210. Therefore, the frequency multiplier 212 for the core PLL 210 may be set to vary less which means its damping factor will vary less. This embodiment of the present invention provides the advantages and benefits of damping factor variation reduction due to the ability to control the loop filter resistance, natural frequency variation reduction due to the ability to control the charge pump currents (i.e., charge pump to VCO tail current ratio), as well as minimizing the damping factor due to the use of a cascaded PLL configuration.

Figure 9:
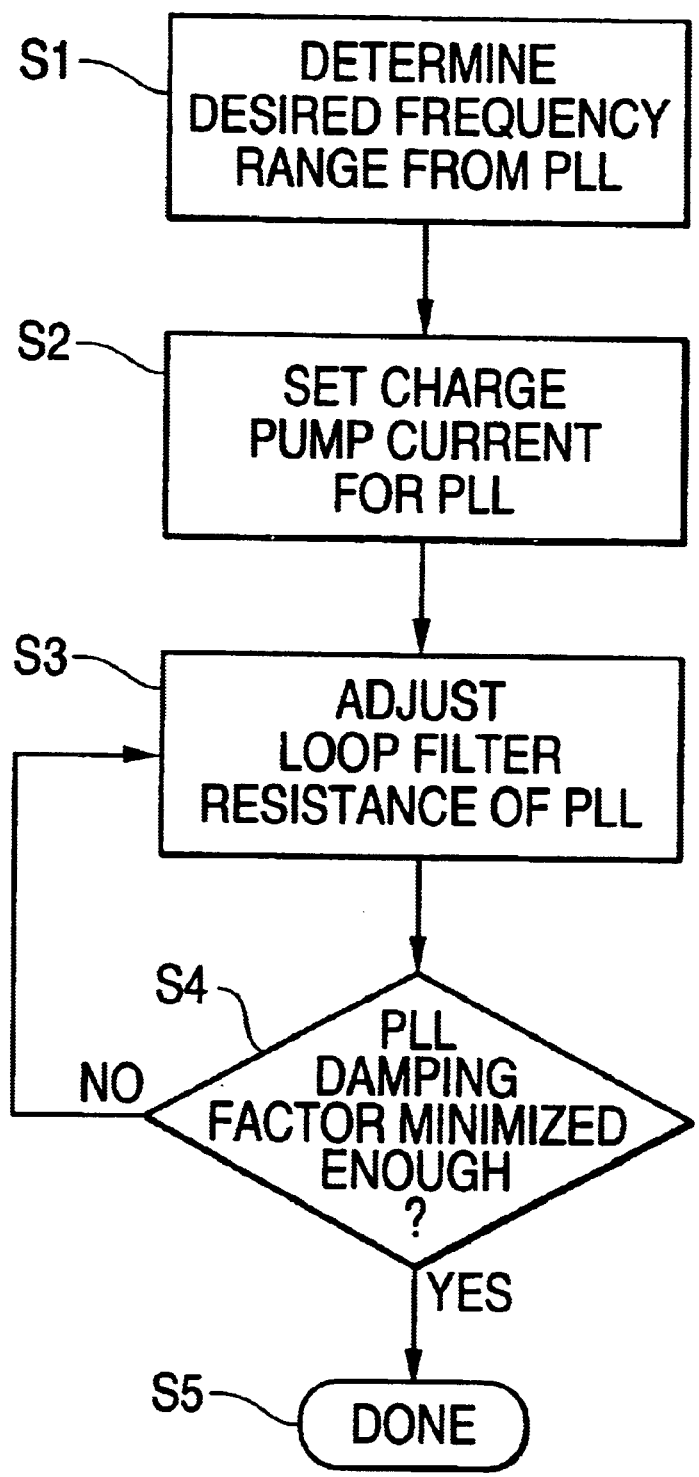
FIG. 9 is a flowchart of a process for minimizing variations on the damping factor of a PLL according to an example embodiment of the present invention.

FIG. 9 shows a flowchart of a process for minimizing variations on the damping factor of a PLL according to an example embodiment of the present invention. A desired frequency range from the PLL is determined S1. A charge pump current for the PLL may be set based on the desired frequency range S2. A loop filter resistance of the PLL may be adjusted to minimize variations on the damping factor of the PLL as the frequency of the PLL changes S3. It is determined if the variation on the damping factor has been minimized as much as desired S4, and if not the loop filter resistance may be further adjusted S3. If the variation on the damping factor has been minimized as much as desired the process ends S5.

Figure 10:
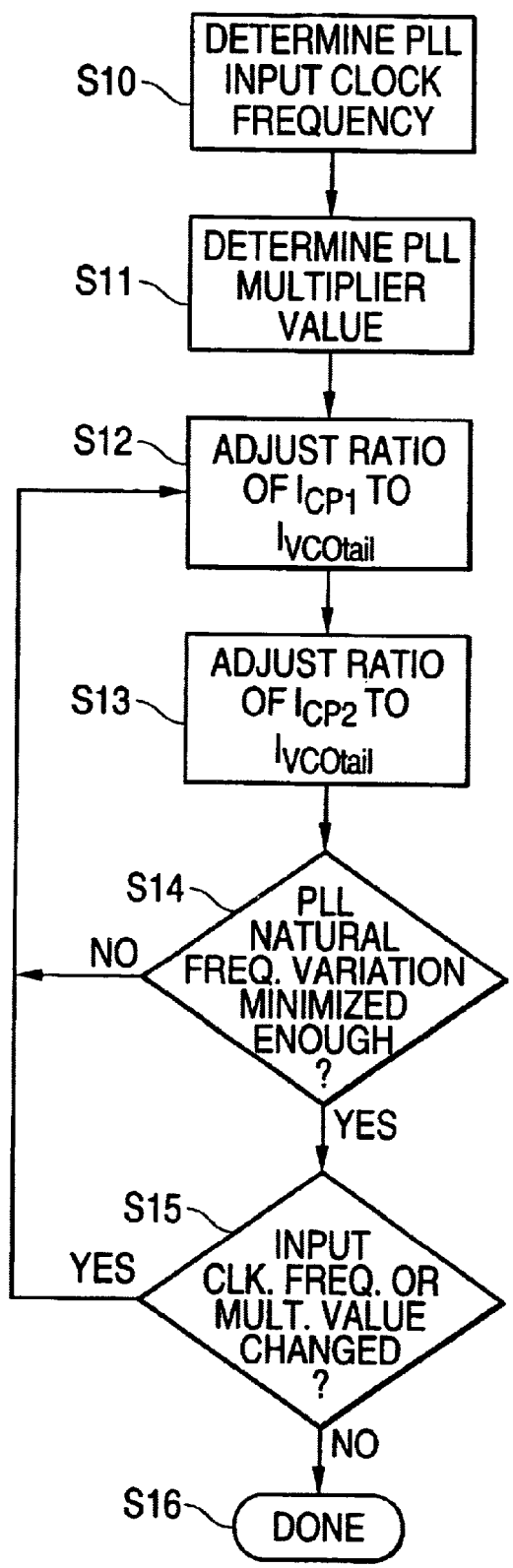
FIG. 10 is a flowchart of a process for minimizing variations on the natural frequency of a PLL according to an example embodiment of the present invention.

FIG. 10 shows a flowchart of a process for minimizing variations on the natural frequency of a PLL according to an example embodiment of the present invention. The frequency of an input clock to the PLL is determined S10. The value of the PLL multiplier is determined S11. A ratio of the current in a first charge pump ($I_{CP1}$) to a VCO tail current ($I_{VCOtail}$) may be adjusted S12. A ratio of the current in a second charge pump ($I_{CP2}$) to the VCO tail current ($I_{VCOtail}$) may be adjusted S13. It is determined if the effect on the natural frequency of the PLL has been minimized as much as desired S14, and if not, the two ratios may be further adjusted S12, S13. If the effect on the natural frequency has been minimized as much as desired, it is determined if the input clock frequency or the PLL multiplier value has changed S15, and if so, the two ratios may be further adjusted S12, S13. If the input clock frequency and the PLL multiplier value have not changed, the process ends S16.

Methods and apparatus according to the present invention are advantageous in that reduction on the variations on damping factor and natural frequency may be achieved with or without the use of cascaded PLLs. Moreover, the present invention allows reduction of the variation on damping factor and natural frequency using a single PLL configuration that is even smaller than variations achieved by using a basic cascading PLL configuration. Moreover, the present invention may be implemented in embodiments using cascaded PLLs to achieve even further smaller variations on damping factor and natural frequency.

It is noted that the foregoing examples have been provided merely for the purpose of explanation and are in no way to be construed as limiting of the present invention. While the present invention has been described with reference to a preferred embodiment, it is understood that the words that have been used herein are words of description and illustration, rather than words of limitation. Changes may be made within the purview of the appended claims, as presently stated and as amended, without departing from the scope and spirit of the present invention in its aspects. Although the present invention has been described herein with reference to particular methods, materials, and embodiments, the present invention is not intended to be limited to the particulars disclosed herein, rather, the present invention extends to all functionally equivalent structures, methods and uses, such as are within the scope of the appended claims.

What is claimed is:

1. A method for minimizing variations on a damping factor of a Phase Locked Loop (PLL) comprising:
   determining a desired frequency range for the PLL;
   setting a charge pump current for the PLL based on the desired frequency range; and
   adjusting a loop filter resistance of the PLL, by controlling resistive elements in the PLL, to minimize variations on the damping factor of the PLL as the frequency of the PLL changes.

2. The method according to claim 1, further comprising controlling the resistive elements using control signals, the control signals being individually programmable external to the PLL.

3. The method according claim 2, further comprising controlling resistive elements comprising Metal Oxide Semiconductor (MOS) devices, each control signal controlling a separate MOS device.

4. The method according to claim 1, further comprising connecting a second PLL to the input of the PLL in a cascaded configuration.

5. The method according to claim 4, further comprising connecting at least one multiplier stage between the second PLL and the PLL.

6. The method according to claim 1, further comprising connecting at least one multiplier stage to the input of the PLL, the at least one multiplier stage being multiplexed to the input of the PLL.

7. The method according to claim 1, further comprising setting an Nbias voltage for the PLL based on the desired frequency range.

8. A phase locked loop (PLL) comprising:
   a loop filter resistor section comprising a resistive element; and
   a voltage controlled oscillator (VCO) operatively connected to the loop filter resistor section,
   wherein a control signal input from external to the PLL is operatively connected to the resistive element, the resistance of the loop filter resistor section being adjustable by controlling the control signal input to vary the resistance of the resistive element, the loop filter resistance adjustable to minimize variations on the damping factor of the PLL as the frequency of the PLL changes.

9. The PLL according to claim 8, wherein the resistive element comprises an MOS device.

10. The PLL according to claim 9, wherein the control signal input controls the MOS device by enabling or disabling the MOS device.

11. The PLL according to claim 8, further comprising a switching device operatively connecting the control signal input to the resistive element.

12. The PLL according to claim 11, wherein the switching device comprises a pass gate.

13. A method for minimizing variations on a natural frequency of a Phase Locked Loop (PLL) comprising:
determining a frequency of an input clock to the PLL;
determining a value of a PLL multiplier;
adjusting a first ratio of a current in a first charge pump to a VCO tail current; and
adjusting a second ratio of a current in a second charge pump to the VCO tail current,
wherein the first ratio and the second ratio are adjustable to minimize variations on the natural frequency of the PLL as at least one of the input clock frequency and the PLL multiplier value of the PLL changes.

14. The method according to claim 13, further comprising adjusting the first ratio and the second ratio by controlling at least one first current source in the first charge pump and at least one second current source in the second charge pump respectively using control signals, each control signal enabling or disabling one of the at least one first current source and the at least one second current source.

15. The method according to claim 14, further comprising adjusting the first ratio and the second ratio by controlling the control signals externally from the first charge pump and the second charge pump.

16. The method according to claim 14, further comprising controlling each at least one first current source and each at least one second current source individually using one of the control signals dedicated to each at least one first current source and each at least one second current source.

17. The method according to claim 13, further comprising controlling a voltage control node of the VCO using the current in the first charge pump.

18. The method according to claim 13, further comprising controlling a bias current of the VCO using the current in the second charge pump.

19. A phase locked loop (PLL) including a charge pump, the charge pump comprising:
a current source;
a control signal input operatively connected to the current source, the control signal enabling or disabling the current source; and
a voltage controlled oscillator (VCO), the current source supplying current to the VCO,
wherein a ratio of a current in the current source to a VCO tail current is adjustable to minimize variations on a natural frequency of the PLL as an input clock frequency or a PLL multiplier value of the PLL changes.

20. The PLL according to claim 19, wherein the current source supplies current to a voltage control node of the VCO.

21. The PLL according to claim 19, wherein the current source supplies current to a bias current of the VCO.

22. A microcircuit comprising a processor and a phase locked loop (PLL), the PLL including:
a loop filter resistor section comprising a resistive element; and
a voltage controlled oscillator (VCO) operatively connected to the loop filter resistor section,
wherein a control signal input from external to the PLL is operatively connected to the resistive element, the resistance of the loop filter resistor section being adjustable by controlling the control signal input to vary the resistance of the resistive element, the loop filter resistance adjustable to minimize variations on the damping factor of the PLL as the frequency of the PLL changes.

23. The microcircuit according to claim 22, wherein the resistive element comprises an MOS device.

24. The microcircuit according to claim 23, wherein the control signal input controls the MOS device by enabling or disabling the MOS device.

25. A microcircuit comprising a processor and a phase locked loop (PLL) including a charge pump, the charge pump including:
a current source;
a control signal input operatively connected to the current source, the control signal enabling or disabling the current source; and
a voltage controlled oscillator (VCO), the current source supplying current to the VCO,
wherein a ratio of a current in the current source to a VCO tail current is adjustable to minimize variations on a natural frequency of the PLL as an input clock frequency or a PLL multiplier value of the PLL changes.

26. The microcircuit according to claim 25, wherein the current source supplies current to a voltage control node of the VCO.

27. The microcircuit according to claim 25, wherein the current source supplies current to a bias current of the VCO.

28. A system for minimizing variations on damping factor and natural frequency comprising:
a loop filter resistor section comprising a resistive element;
a first control signal input operatively connected to the resistive element;
a current source;
a second control signal input operatively connected to the current source, the second control signal enabling or disabling the current source; and
a voltage controlled oscillator (VCO), the VCO operatively connected to the loop filter resistor section, the current source supplying current to the VCO,
wherein the first control signal input and the second control signal input are useable to minimize variations on the damping factor and the natural frequency of the system, the loop filter resistance being adjustable to minimize variations on the damping factor, as the frequency of the system changes, by controlling the control signals, and a ratio of the sum of the current in the current source to a VCO tail current is adjustable to minimize variations on the natural frequency, as an input clock frequency or a multiplier value changes, by controlling the second control signal.

* * * * *